(12) United States Patent
Kizilyalli et al.

(10) Patent No.: US 6,320,238 B1
(45) Date of Patent: Nov. 20, 2001

(54) GATE STRUCTURE FOR INTEGRATED CIRCUIT FABRICATION

(75) Inventors: Isik C. Kizilyalli; Yi Ma; Sailesh Mansinh Merchant; Pradip Kumar Roy, all of Orlando, FL (US)

(73) Assignee: Agere Systems Guardian Corp., Orlando, FL (US)

(*) Notice: Subject to any disclaimer, the term of this patent is extended or adjusted under 35 U.S.C. 154(b) by 0 days.

(21) Appl. No.: 09/339,895

(22) Filed: Jun. 25, 1999

Related U.S. Application Data

(63) Continuation-in-part of application No. 08/995,435, filed on Dec. 22, 1997.
(60) Provisional application No. 60/033,839, filed on Dec. 23, 1996.

(51) Int. Cl.[7] .................................................. H01L 29/76
(52) U.S. Cl. ........................ 257/410; 257/295; 257/310; 257/411
(58) Field of Search .................................. 257/295, 310, 257/410, 411, 637

(56) References Cited

U.S. PATENT DOCUMENTS

| | | | |
|---|---|---|---|
| 4,851,370 | 7/1989 | Doklan et al. | 437/225 |
| 4,891,684 | * 1/1990 | Nishioka et al. | 357/51 |
| 5,153,701 | * 10/1992 | Roy | 357/54 |
| 5,468,687 | * 11/1995 | Carl et al. | 437/235 |
| 5,814,562 | 9/1998 | Green et al. | 437/60 |
| 5,912,797 | * 6/1999 | Schneemeyer et al. | 361/311 |
| 6,075,691 | * 6/2000 | Duenas et al. | 361/321.5 |
| 6,118,146 | * 9/2000 | Park et al. | 257/310 |

OTHER PUBLICATIONS

"Stacked High-$\epsilon$ Gate Dielectric For Gigascale Integration Of Metal–Oxide–Semiconductor Technologies", P.K. Roy et al., *Applied Physics Letter*, vol. 72, No. 22, Jun. 1, 1998, pp. 2835–2837.

"MOS Transistors With Stacked SiO2–Ta2O5–SiO2 Gate Dielectrics For Giga–scale Integration Of CMOS Technologies", I.C. Kizilyalli et al., *IEEE Electron Device Letters*, vol. 19, No. 11, Nov. 1998, pp. 423–425.

"Characterization Of Stacked Gate Oxides By Electron Holography," W. D. Rau et al., Applied Physics Letters 68 (24), Jun. 10, 1996.

* cited by examiner

*Primary Examiner*—Sara Crane

(57) ABSTRACT

The present invention relates to a gate stack structure having a dielectric material layer disposed on a substrate with a gate electrode disposed thereon. In an exemplary embodiment, the dielectric material layer has an equivalent electrical thickness of 2.2 nm or less and includes at least one layer other than silicon dioxide. Furthermore, the dielectric material layer of the present invention enables device scaling and provides (1) decreased leakage current and improved tunneling voltage compared to a conventional gate dielectric; and (2) avoids the perils of ultra-thin silicon dioxide when used exclusively as the gate dielectric.

16 Claims, 1 Drawing Sheet

PLASMA OXIDATION PROCESS FOR FORMATION OF 3–10Å $SiO_2$

| PARAMETERS | RANGE | PREFERABLE |
|---|---|---|
| OXIDATION TEMPERATURE | 250° C – 500° C | 300° C |
| PLASMA POWER | 10 WATTS – 500 WATTS | 65 WATTS |
| PRESSURE | 1 mTORR – 500 TORR | 300 mTORR |
| $O_2$ | 1 SCCM – 500 sccm | 10 sccm |
| $N_2$ | 100 SCCM – 2000 sccm | 1000 sccm |

UV $O_3$ OXIDATION PROCESS FOR FORMATION OF 3–8Å $SiO_2$

| PARAMETERS | RANGE | PREFERABLE |
|---|---|---|
| OXIDATION TEMPERATURE | 24° C   200° C | 50° C |
| PRESSURE | 1 mTORR – 500 TORR | 200 TORR |
| $O_2$ | 1 SCCM – 2000 sccm | 1000 sccm |

GATE STRUCTURE FOR INTEGRATED CIRCUIT FABRICATION

CROSS REFERENCE TO RELATED APPLICATIONS

The present application is a continuation-in-part of U.S. patent application Ser. No. 08/995,435, filed on Sep. 12, 1997 (assigned to the assignee of the present invention), which claims priority from U.S. provisional application No. 60/033,839, filed Dec. 23, 1996, to I. C. Kizilyalli, et al. The disclosures of the above referenced utility and provisional patent applications are specifically incorporated herein by reference.

FIELD OF THE INVENTION

The present invention relates to a gate stack structure for integrated circuits and its method of manufacture.

BACKGROUND OF THE INVENTION

Giga-scale electronic device integration and miniaturization has resulted in 0.25 micron (and smaller) minimum device feature size. In many memory circuits, the metal oxide semiconductor (MOS) transistor is employed along with capacitors. As device miniaturization continues, the gate length and the capacitor plate area are reduced. In the transistor, this reduced feature size can reduce the device transconductance, while in a capacitor, the capacitance can be reduced to an unacceptable level. To this end, the capacitance of storage capacitors in dynamic memories, for example, is reduced with the reduced feature sizes, and the memory cells may become error prone.

As can be readily appreciated by one of ordinary skill in the art, the gate structure of a MOS transistor approximates a parallel plate capacitor, with the gate and semiconductor substrate forming the electrodes thereof. It is desired to compensate for the reduced capacitance that results from the reduced feature sizes in order to maintain (if not increase) the transconductance and to maintain (if not reduce) the threshold voltage of the MOS field effect transistor.

In order to maintain or increase the capacitance (of the MOS transistor or the storage capacitor with reduced plate area), it is necessary either to decrease the spacing between the electrodes of the capacitor or to use a material having a higher dielectric constant. Unfortunately, conventional dielectrics such as ultra-thin (less than 3.5 nm) silicon dioxide layers have hindered the effort to reduce the spacing between the electrodes. For example, as the tunneling limit of 2.5 nm for silicon dioxide is approached, tunneling currents exceed acceptable values. By using materials having a higher dielectric constant than silicon dioxide, the desired capacitance may be achieved, while the problems of leakage currents and processing difficulties associated with dimensionally thin dielectrics may be diminished.

One example of the use of high dielectric constant stacked gate dielectric structures is disclosed in the above-captioned parent application to L. C. Kizilyalli et al. One embodiment disclosed in the application to Kizilyalli, et al. has a layer of silicon dioxide grown and densified on an oxidizable substrate; a layer of high dielectric constant (high-k) material; and a deposited layer of silicon dioxide disposed on the high dielectric constant material. The deposited oxide layer is used, among other reasons, as a "buffer" layer between the high-k material and the polysilicon gate electrode disposed on the deposited silicon dioxide layer. For example when the high-k layer is tantalum pentoxide, the deposited $SiO_2$ layer buffers the high-k layer from the polysilicon gate, preventing reduction of the tantalum pentoxide by the polysilicon layer. This prevents consequential elemental tantalum in the high-k layer, and undesired shorting in the high-k layer. Transistors using the stacked gate dielectric material of the parent application have characteristics of a low concentration of interface trap sites, an improved tunneling voltage, negligible fixed charge ($Q_f$), improved interface carrier mobility, and a low effective dielectric thickness compared to other conventional structures.

While the dielectric stack for use as the gate structure in a MOSFET or as a storage capacitor in an integrated circuit of the parent application has facilitated miniaturization by compensating for reduced feature size, there is a need to even further reduce feature size. As discussed above, there is a need to reduce the dielectric thickness to facilitate device scaling and integration, in general. While the reduction in dielectric thickness of conventional materials, such as silicon dioxide, will increase the capacitance, there is a lower limit on silicon dioxide thickness were deleterious electrical effects are encountered. Accordingly, it is desired to have dielectric material(s) which result in the same capacitance as a particular thickness of silicon dioxide, but which can be processed with less complications and which do not suffer from the electrical shortcomings of ultra-thin layers of silicon dioxide. Further, what is needed is a dielectric structure, and its method of fabrication which enables a further reduction in feature size and thus an increase in integration/miniaturization, while avoiding the problems of ultra-thin layers of silicon dioxide used in conventional structures.

SUMMARY OF THE INVENTION

The present invention relates to a gate stack structure and its method of manufacture having a dielectric material layer disposed over a substrate with a gate electrode disposed over the dielectric material layer. In an exemplary embodiment, the dielectric material layer has an equivalent electrical thickness of 2.2 nm or less and includes at least one layer other than silicon dioxide. The structure is fabricated by disposing a grown oxide layer on a substrate, disposing at least one layer of high-k dielectric thereover, and disposing a conductive layer directly on the high-k layer.

BRIEF DESCRIPTION OF THE DRAWING

The invention is best understood from the following detailed description when read with the accompanying drawing figures. It is emphasized that, in accordance with common practice in the semiconductor industry, the various features are not necessarily to scale. In fact, the dimensions of the various features may be arbitrarily increased or reduced for clarity of discussion.

DETAILED DESCRIPTION OF THE INVENTION

Figures 1, 2:
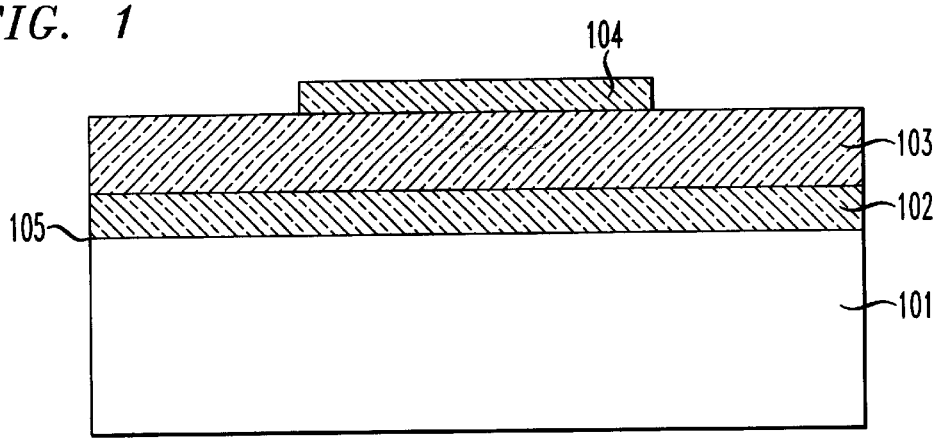
FIG. 1 is a cross-sectional view of an exemplary embodiment of the present invention.
FIG. 2 is a table showing exemplary process parameters for forming the grown oxide layer.

For the purposes of the disclosure of their invention, applicants define the following terms:

(1) Equivalent electrical thickness means that the chosen thickness of the dielectric material layer in a particular capacitor results in the same capacitance as a capacitor using a specified thickness of silicon dioxide. This term takes into account both the dielectric properties of the materials used and the number of layers of dielectric material employed in a particular dielectric material layer in a capacitor structure. For example, a capacitor structure using a single 6.0 nm thick layer of tantalum pentoxide has an equivalent electrical thickness of 1.0 nm (of silicon dioxide).

(2) Dielectric material layer refers most generally to a dielectric layer structure (for use in a gate structure of a MOSFET or in a capacitor) having an equivalent electrical thickness on the order of 2.2 nm or less and including at least one layer other than silicon dioxide.

As discussed in detail below and in accordance with an exemplary embodiment of the invention shown in FIG. 1, an oxidizable substrate 101 has disposed thereon a grown oxide layer with a silicon dioxide layer grown thereunder. The grown oxide layer and the oxide layer thereunder are shown generally at 102. A layer of high dielectric constant material is shown generally at 103, with the gate electrode as shown at 104. In an exemplary embodiment, the substrate 101 may be monocrystalline silicon but could be any oxidizable layer such as polysilicon or an epitaxial layer of silicon. The high-k dielectric material 103, which suppresses leakage current, may be $Ta_2O_5$ and the gate electrode 104 is, for example, a metal such as tungsten. By virtue of the structure shown in FIG. 1, the equivalent electrical thickness of the stack of layers 102 and 103 may be 2.2 nm or less. However, the layer of high-k material has a dimensional thickness of 3.0 nm or more, which facilitates the fabrication process and overcomes processing and performance issues associated with ultra-thin silicon dioxide layers. In other words, the gate stack structure of the present invention most generally is a dielectric material layer disposed between a substrate and a gate electrode where the dielectric material layer has an equivalent electrical thickness of 2.2 nm or less and includes at least one layer other than silicon dioxide.

Major factors contributing to defects in thin-oxide gate dielectrics are growth-induced micropores and the intrinsic stress within the oxide layer. The micropore network that forms in the silicon dioxide causes short-circuit paths for diffusional mass transport and for current leakage. Additionally, stress within the silicon dioxide layer usually increases both the size and density of the micropores. Therefore, in developing thin dielectrics with low defect densities, not only is it necessary to reduce the initial defect densities, but also to reduce local stress-gradients near the silicon-silicon dioxide interface using a stress-accommodating layer. To this end, it is necessary to use an interface within the dielectric that acts as a stress cushion and a defect sink. In an exemplary embodiment of the invention, this layer may be the silicon dioxide layer (referenced herein as the stress-free oxide layer) grown underneath the first grown oxide layer by an oxidizing reaction at the interface. This oxide layer may be grown under near-equilibrium conditions and results in the traps being annealed out and a substantially planar, nearly stress-free silicon-silicon dioxide interface being formed by the newly grown silicon dioxide.

Further details of the oxide growth layer at the Si—$SiO_2$ interface can be found in the following references: U.S. Pat. No. 4,851,370; U.S. patent application Ser. No. 08/995,435; *Stacked-$\in_r$ Gate Dielectric For Giga Scale Integration Of Metal-Oxide-Semiconductor Technologies*, Applied Physics Letters, Vol. 72, No. 22, Jun. 1, 1998 to Roy et al.; and *MOS Transistors With Stacked $SiO_2$—$Ta_2O_5$—$SiO_2$ Gate Dielectric To Giga-Scale Integration Of The MOS Technologies*, IEEE Electron Letters, Vol. 19, No. 11, November 1998 to Kizilyalli et al. The disclosures of the above captioned patent and articles are incorporated specifically herein by reference. It is of interest to note, however, that consistent with reducing the equivalent electric thickness for scaling of the gate dielectric layer, the present invention eliminates the deposited oxide layer discussed in the above captioned patent, parent application and the articles by Roy, et al and Kizilyalli, et al. To this end, by choosing a gate material to be other than poly-Si, the gate electrode can be disposed directly on the high-k material (for example tantalum pentoxide).

By foregoing a deposited layer of silicon dioxide on the high-k material, applicants have realized certain advantages. The equivalent electrical thickness, as referenced above, is reduced. Furthermore, the elimination of the top layer of silicon dioxide in the dielectric stack can increase the capacitance of the capacitor structure in two ways. First, the capacitance may be increased by reducing the spacing between the electrodes or plates of the capacitor. Second, eliminating a layer eliminates a series capacitor. This follows from the fact that stacked dielectric layers in a capacitor structure are equivalent to capacitors in series. Accordingly, eliminating the deposited oxide layer increases the capacitance, and enables the disposition of a dimensionally thicker dielectric material layer in a capacitor structure; thus the perils of processing ultra-thin films, and the problem of tunneling in thin films of silicon dioxide may be avoided. In addition, by forming a metal gate electrode directly on the high-k material, the "buffer" layer of deposited silicon dioxide may be eliminated.

Turning to FIG. 1, the substrate 101, exemplary monocrystalline silicon, has a relatively thin layer of silicon dioxide grown thereon. This layer can be as thin as on the order of 3–8 Å, and is thermally grown at 650–850° C. at low pressure (less than 1 Torr). This silicon dioxide layer is the first layer in the dielectric stack and is used as a passivating layer for the silicon substrate. While thermally grown silicon dioxide can be effected by rapid thermal oxidation, it is also within the purview of the present invention that this oxidation step be carried out by a low-temperature plasma (LTP) oxidation process or by a UV $O_3$ process. Ultra-violet wavelength radiation is used to activate the ozone, as is well known in the art. The plasma oxidation can also be used to fabricate the grown oxide layer, again well known to one of ordinary skill in the art. FIG. 2 is a tabular representation of exemplary process parameters for both the low temperature plasma and UV ozone processes. Finally, it is of interest to note that while the substrate is illustratively oxidizable silicon, other substrates can be employed. Such substrates include, but are not limited to, III–V semiconductors and SiGe semiconductors.

After the silicon dioxide layer is grown, the high dielectric constant material 103 is deposited. In the exemplary embodiment, this layer 103 is $Ta_2O_5$ deposited by metal-organic chemical vapor deposition (MOCVD), or other techniques well known to one of ordinary skill in the art.

The oxidation/anneal step to form the stress free silicon dioxide layer is carried out at 650° C., and approximately 0.9 Torr and in an oxidizing ambient (for example $N_2$ and $O_2$) resulting in the planar and stress-free silicon-silicon dioxide interface 105. This layer is on the order of 3–5 Å in thickness resulting from the diffusional transport of the oxidizing species (in this case, oxygen). Again, further details of the formation of the stress free oxide layer can be found in the above incorporated patent, patent application and articles. In the oxidizing/anneal process, the ambient oxygen traverses the high-k layer and results in the grown oxide layer underneath. By virtue of the grown layer of silicon dioxide and the stress free oxide layer 102 between the layer 101 of Si and the high-k dielectric layer 103, the phase transformation temperature of the high-k dielectric layer is increased. For example, in the case of tantalum pentoxide, the crystal phase transformation temperature is increased to on the order of 850° C.; suitably high for most processing steps to avoid the crystallization of the $Ta_2O_5$. Alternatively, if one wishes to further increase the crystal phase transformation of the high-k dielectric layer, suitable implants or dopants can be added. In the exemplary embodiment, the high-k layer of $Ta_2O_5$ can be implanted with nitrogen at a suitable dose and energy, or doped with a suitable concentration of aluminum. This increases the phase transformation temperature to approximately 950° C., suitably high for source/drain activation anneal steps.

The gate electrode 104 is then disposed on the dielectric material layer by techniques known to one of ordinary skill in the art. The gate electrode includes a metal such as W or $W_xSi_y$. However, other materials can be used in keeping with the present disclosure. These include, but are in no way limited to silicide nitrides (for example $WSi_xN_y$, $TaSi_xN_y$, and $MoSi_xN_y$); and metal nitrides (for example nitrides of Ta, Ti and Mo). Finally, the present invention envisions the use of a multi-layer gate electrode material, for example $W_xSi_y.\backslash WSi_xN_y\backslash W_xSi_y$. In one embodiment, the gate electrode is a material other than polysilicon.

In an exemplary embodiment, the dielectric material layer is the grown oxide layer with the stress free oxide layer grown thereunder, and at least one layer of high-k dielectric material thereon. This layer of high-k dielectric material has an equivalent electrical thickness (again, relative to silicon dioxide) on the order of 0.5 to 1.0 nm. This translates to a layer of $Ta_2O_5$ having a dimensional thickness of approximately 3.0 to 6.0 nm. This is an illustrative thickness range, and it is possible to have the $Ta_2O_5$ layer as thick as 15.0 nm. It is important to note that $Ta_2O_5$ is an exemplary high-k material, and it is clearly understood that other materials can be used. In particular, $ZrO_2$, $TiO_2$, and perovskite materials can be used to effect the high dielectric constant ultra-thin gate dielectric structure of the present invention. Finally, it is conceivable that, in addition to the above mentioned materials or combinations thereof, other materials, combination of materials or such material stacks, within the purview of one of ordinary skill in the art, can be used to form the dielectric material layer for achieving the desired 22 Å (or less) equivalent electrical thickness. (The above stated equivalent electrical thickness is illustrative, and is preferably in the range of 1.0 to 2.0 nm). However, in any case, the chosen gate material should not adversely affect the dielectric properties of the dielectric material layer. For example, as discussed above, polysilicon should not be disposed directly on many of the high-k materials discussed above, as it increases leakage current in the high-k layer, thus degrading its dielectric properties.

The high-k dielectric stack structure of the invention of the present disclosure is envisioned for use in integrated circuits having high performance analog and mixed signal CMOS circuits. This ability to have analog and mixed signal CMOS circuits on a silicon IC represents a significant advantage over GaAs and SiGe based devices, from the standpoints of cost and complexity of manufacture. The ability to reduce the equivalent electrical thickness enables scaling, and improvements in integration. A set of rules, commonly referred to as scaling rules, are used as a guide by those skilled in the art in their choice of material parameters, structures and relative physical dimensions. Analysis of MOS device physics and the scaling rules can be derived from Poisson's equation and the current-density equation. As would be appreciated by one of ordinary skill in the art, in MOS devices, gate length scaling reduction is often necessary to achieve miniaturization. In order to accomplish gate length ($L_G$) reduction, the oxide thickness ($t_{ox}$) must be reduced to maintain a particular aspect ratio. However, as discussed above, fabricating silicon dioxide in very thin layers can be rather complicated from a processing perspective. Furthermore, tunneling can be problematic and channel control parameters can be adversely impacted when silicon dioxide layers are too thin.

As stated, there are advantages achieved by the elimination of the deposited $SiO_2$ layer; particularly advantages of reduced equivalent electrical thickness and the ability to scale device dimensions within the parameters of the scaling rules. By virtue of the ability to scale down the equivalent electrical thickness of the oxide layer, the gate length, $L_G$, can be proportionately reduced. By decreasing $L_G$ the intrinsic transconductance $g_m$ may be increased. As is well known to one of ordinary skill in the art, the intrinsic transconductance $g_m$ can be approximated by $$g_m \cong \left(\frac{\epsilon_{ox}}{t_{ox}}\right)\frac{v_{sat}}{L_g} \tag{1}$$

where $\epsilon_{ox}$ is the dielectric constant of the gate dielectric material layer and $v_{sat}$ is the saturation velocity.

Accordingly, by virtue of the present invention, the gate length's being scaled down results in increased device transconductance. Furthermore, the ability to reduce the gate length results in an increased saturation velocity, and an increased cut-off frequency, $f_t$, given by:

$$f_t \cong \left(\frac{v_{sat}}{2L_g}\right) \tag{2}$$

where $f_t$ is the cutoff frequency.

Finally, it can be shown that due to the reduced $L_g$, increased $v_{sat}$ and increased $g_m$; that the effective $f_t$ is both increased and nearly constant over a range of load capacitances, $C_{load}$. The invention of the present disclosure enables $t_{ox}$ to be on the order of 20 Å and below Lg on the order of 0.18 microns or less, and devices with a cut-off frequency on the order of 30 GHz and higher; quite suitable for analog and mixed signal CMOS circuits.

The present invention has applicability to a wide variety of integrated circuits, to include but not be limited to logic, DRAM, FLASH, and analog and mixed signal CMOS circuits. The high quality silicon-silicon dioxide interface results in a low interface trap density, while the high-dielectric constant tantalum pentoxide layer suppresses leakage current. Finally, the tungsten metal eliminates the depletion problems experienced with poly-silicon gate electrodes. The present invention results in improved gate dielectric reliability, reduced gate leakage, low threshold voltage, improved sub-threshold characterizes and low-voltage dual gate applicability.

The invention having been described in detail, it is clear that variations and modifications to the invention disclosed here and above will be apparent to one of ordinary skill in the art to the extent that these modifications results in an ultra-thin gate dielectric structure with improved characteristics as recited herein, such redeemed within the scope of the present invention.

What is claimed:

1. An integrated circuit, comprising:
a substrate;
a dielectric material layer disposed over said substrate, said dielectric material layer having an equivalent electrical thickness of 2.2 nm or less, and said dielectric material layer including a stress free oxide layer located on said substrate, a grown oxide layer located on said stress free oxide layer and a layer of high-k dielectric material located on said grown oxide layer; and
an electrode disposed over said dielectric layer.

2. An integrated circuit as recited in claim 1, wherein said electrode is chosen from the group consisting of W, $W_xSi_y$, $WSi_xN_y$, $TaSi_xN_y$, $MoSi_xN_y$, Ta, Ti, and Mo.

3. An integrated circuit as recited in claim 1, wherein said high-k dielectric layer is selected from the group consisting of $Ta_2O_5$, $ZrO_2$, $TiO_2$, and perovskite materials.

4. An integrated circuit as recited in claim 1, wherein said electrode is metal.

5. An integrated circuit as recited in claim 1, wherein said grown oxide layer has a thickness on the order of 0.3–0.5 nm.

6. An integrated circuit as recited in claim 1, wherein said high-k dielectric material is substantially non-crystalline.

7. An integrated circuit as recited in claim 1, wherein said high-k dielectric material is doped with nitrogen.

8. An integrated circuit as recited in claim 1, wherein said substrate is silicon.

9. An integrated circuit as recited in claim 1, wherein said substrate is epitaxial silicon.

10. An integrated circuit as recited in claim 1, wherein said dielectric material layer has an equivalent electrical thickness in a range of approximately 1.0 to 2.2 nm.

11. An integrated circuit, comprising:
a substrate;
a stress free oxide layer located over said substrate;
a grown oxide layer located on said stress free oxide layer;
at least one layer of high-k dielectric material disposed on said grown oxide layer; and
an electrode disposed directly on said at least one layer of high-k dielectric material.

12. An integrated circuit as recited in claim 11, wherein said at least one layer of high-k dielectric material is tantalum pentoxide, having a thickness in the range of 3.0–15.0 nm.

13. An integrated circuit as recited in claim 11, wherein said electrode is metal.

14. An integrated circuit as recited in claim 11, wherein said substrate is and oxidizable layer.

15. An integrated circuit as recited in claim 11, wherein dielectric material layer has an equivalent electrical thickness of 2.2 nm or less.

16. An integrated circuit as recited in claim 11, wherein said electrode is chosen from the group consisting of W, $W_xSi_y$, $WSi_xN_y$, $TaSi_xN_y$, $MoSi_xN_y$, Ta, Ti, and Mo.

* * * * *